United States Patent
Yoshida et al.

(10) Patent No.: US 6,416,830 B2
(45) Date of Patent: *Jul. 9, 2002

(54) COMPOSITE MAGNETIC TUBE AND METHOD OF PRODUCING THE SAME, AND ELECTROMAGNETIC INTERFERENCE SUPPRESSING TUBE

(75) Inventors: Shigeyoshi Yoshida, Abiko; Mitsuharu Sato, Yokohama, both of (JP)

(73) Assignee: Tokin Corporation, Miyagi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/073,004

(22) Filed: Apr. 24, 1998

(51) Int. Cl.$^7$ .............................. H05K 9/00; B29D 23/00

(52) U.S. Cl. .................... 428/34.5; 428/34.7; 428/35.8; 428/36.4; 428/36.8; 428/36.9; 428/36.91; 428/900; 252/62.54; 174/35 R; 174/35 MS; 174/35 GC (58) Field of Search ................................ 428/688, 692, 428/693, 35.7, 36.4, 36.9, 36.91, 148, 402, 900, 34.7, 36.8, 35.8, 34.5; 252/62.51 R, 62.54; 174/35 R, 35 MS, 35 GC (56) References Cited

U.S. PATENT DOCUMENTS 5,827,745 A * 10/1998 Yoshida et al. .......... 252/62.54

FOREIGN PATENT DOCUMENTS

JP       7-117132 A  *  5/1995

OTHER PUBLICATIONS

Derwent Abstract of JP 7–117132 A; Tube for Jointing Corrugated Tubes; Mitsui Petrochemical, May 1995.*

Derwent Abstract of JP 1–294801 A; Iron–Nickel Alloy Powder; Hitachi Metals LTD, Nov. 1989.*

Derwent Abstract of JP 58–59268A; Magnetic Shiel Coating Composition, Tohku Metal IND, Apr. 1983.*

Derwent Abstract of JP 55–157300 A; Wave Absorber with Good Moldability; Pioneer Electronic, Dec. 1980.*

JPO Abstract of JP 5–291781 A; Covering Material for Cable; Ogiwara, Nov. 1993.*

JPO Abstract of JP 5–283883 A; Electromagnetic Shield Material; Takuo, Oct. 1993.*

JPO Abstract of JP 55–5719 A; Centrifuge; Suzuki;. Jan. 1980.*

* cited by examiner

Primary Examiner—Rena L. Dye
(74) Attorney, Agent, or Firm—Morgan, Lewis & Bockius LLP (57) ABSTRACT

A tube for externally covering or bundling electric cables is provided for suppressing radiation of undesired electromagnetic waves. The tube is made of a material in which soft magnetic powder is mixed with and dispersed into an organic binding agent. For protecting the cable from the undesired electromagnetic waves from the exterior, it is preferable to provide a conductor layer at an outer side of a composite magnetic layer. For facilitating mounting onto the cable, the tube is provided with a slit in a longitudinal direction. Alternatively, the cable may have a spiral structure. As an organic binding agent, it is preferable to use an elastomer which is excellent in extensible property. Further, it is preferable that the soft magnetic powder is powder being essentially flat.

10 Claims, 6 Drawing Sheets

COMPOSITE MAGNETIC TUBE AND METHOD OF PRODUCING THE SAME, AND ELECTROMAGNETIC INTERFERENCE SUPPRESSING TUBE

TECHNICAL FIELD

The present invention relates to a tube for suppressing radiation of undesired electromagnetic waves from an electric cable connected to a digital electronic device or the like.

BACKGROUND ART

As is well known, a digital electronic device comprises a number of electronic components, such as a random access memory (RAM), a read-only memory (ROM), a microprocessor, and others. Each of these electronic components comprises a number of logic elements, and these electronic components are mounted on a printed circuit board having signal lines (wired conductors) wired around thereon. In recent digital electronic devices, the operation speed of the logic elements can be increased and further the reduction in weight, thickness, length and size of the device has been rapidly advanced. Following this, the mounting density of the electronic components onto the printed circuit board has also been rapidly enhanced.

However, since a signal flowing in the logic element goes with abrupt changes in voltage and current, the electronic component is a generation source of high frequency noise. The high frequency noise causes interactions cooperatively with crosstalk noise or noise due to impedance mismatch so as to induce malfunctions relative to other electronic components in the printed circuit board and to adversely affect other systems. Further, following the high-density mounting of the electronic components onto the printed circuit board and the reduction in size of the electronic components, the electrostatic coupling between the electronic components is increased so that the electromagnetic interference is liable to occur in the digital electronic device.

The digital electronic device to be such a noise generation source is connected to other digital electronic devices and a power supply socket via cables.

Accordingly, it is possible that undesired electromagnetic waves are radiated from the cables. Since the undesired electromagnetic waves adversely affect the other electronic devices, it is necessary to suppress it. However, conventionally, no measures have been taken relative to the undesired electromagnetic waves radiated from the cables.

Therefore, an object of the present invention is to provide a composite magnetic tube and its producing method, and an electromagnetic interference suppressing tube which can be used for suppressing radiation of undesired electromagnetic waves from a cable connected to a digital electronic device or the like.

When a plurality of vinyl coated wires (cables) are wired, it is general to bundle them using a bundling band or spiral tube of synthetic resin. In this case, power lines and signal lines are often mixed. In case of the mixed wiring, electric signals are degraded due to increase and induction of crosstalk and, following this, it is possible that a circuit malfunctions.

Another object of the present invention is to provide a composite magnetic tube and its producing method, and an electromagnetic interference suppressing tube which can suppress mutual interferences even when a plurality of vinyl coated wires (cables) are bundled.

A further object of the present invention is to provide a bundling tube which can not only bundle a plurality of cables, but also suppress undesired radiant noise generated from the cables.

DISCLOSURE OF THE INVENTION

According to the present invention, as recited in claim 1, there is obtained a tube made of a composite magnetic material composed of an organic binding agent and soft magnetic powder mixed with and dispersed in the organic binding agent.

According to the present invention, as recited in claim 2, there is obtained a tube having a two-layered structure comprising an inner-side composite magnetic layer made of a composite magnetic material composed of an organic binding agent and soft magnetic powder mixed with and dispersed in the organic binding agent, and a conductor layer provided on an outer surface of the composite magnetic layer.

Modifications of these tubes or preferred examples of organic binding materials or soft magnetic materials to be used are recited in claims 3 to 10.

As recited in claim 13 or 14, the tube is suitable to be used as a cover tube for suppressing an undesired electromagnetic interference or as a bundling tube with respect to electric cables. For convenience of mounting onto the cable, it is preferable as recited in claim 11 or 12 that the tube is formed with a slit in a longitudinal direction or formed into a spiral structure.

According to the present invention, as recited in claim 15, there is obtained a method of producing a tube made of a composite magnetic body, characterized in that a melt of a composite magnetic material composed of soft magnetic powder mixed with and dispersed in an organic binding agent is extruded through a die so as to form an annular tube.

Further, as recited in claim 16, a tube with a slit can be obtained by forming the slit in the foregoing annular tube along a longitudinal direction thereof.

Further, as recited in claim 17, a tube of a spiral structure can be obtained by forming a spiral slit in the foregoing annular tube along a longitudinal direction thereof.

BEST MODE FOR CARRYING OUT THE INVENTION

Next, various embodiments of the present invention will be described in detail with reference to the drawings.

Figure 1:
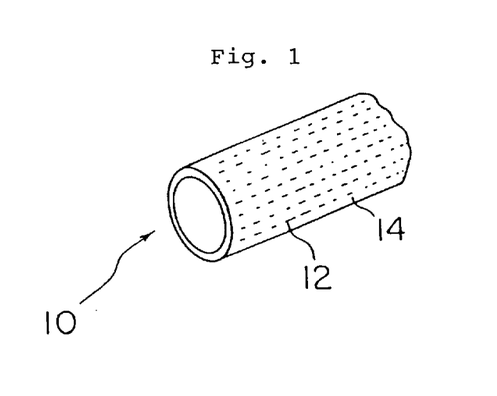
FIG. 1 is a perspective view showing a tube according to a first embodiment of the present invention.

Referring to FIG. 1, a shown tube 10 is a composite magnetic tube made of a composite magnetic material in which soft magnetic powder 12 is mixed/dispersed in an organic binding agent 14.

As the organic binding agent 14, it is preferable to use an elastomer which is excellent in extensible property. Further, it is preferable that the soft magnetic powder 12 is essentially flat powder.

As the organic binding agent 14, thermoplastic resin, such as polyester resin, polyvinyl chloride resin, polyvinyl butyral resin, polyurethane resin, cellulose resin, nitrile-butadiene rubber or stylene-butadiene rubber, or a polymer thereof can be cited.

As the soft magnetic powder 12, an Fe—Al—Si alloy (this is called sendust (trademark)) or an Fe—Ni alloy (permalloy) having a large high frequency permeability can be cited as a typical material thereof. The soft magnetic powder 12 is used by oxidizing the finely powdered surfaces thereof. It is preferable that an aspect ratio of the soft magnetic powder 12 is sufficiently large (for example, approximately not less than 5:1).

Such a composite magnetic tube 10 can be formed by the extrusion molding method. Specifically, using an extruder (not shown), the foregoing composite magnetic material is melted and extruded from a die (not shown) so as to form the composite magnetic tube 10.

The composite magnetic tube 10 is used in such a manner as to coat an electric cable (not shown) radiating undesired electromagnetic waves. By this, the undesired electromagnetic waves radiated from the cable can be absorbed by the soft magnetic powder 12 so as to suppress the radiation of the undesired electromagnetic waves from the cable. Further, by rendering essentially flat the shape of the soft magnetic powder 12, the undesired electromagnetic waves radiated from the cable can be absorbed and suppressed more efficiently. This is because if the shape of the soft magnetic powder 12 is essentially flat, a shape anisotropy appears so that a complex permeability based on a magnetic resonance is increased at a high frequency region.

Figure 2:
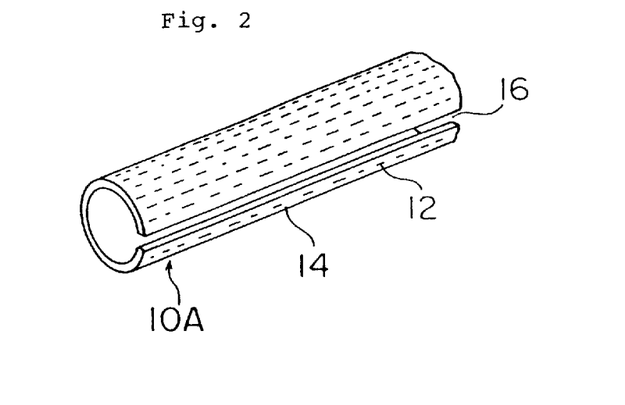
FIG. 2 is a perspective view showing a tube according to a second embodiment of the present invention.

Referring to FIG. 2, a shown tube 10A has the same structure as the composite magnetic tube 10 shown in FIG. 1 except that a slit 16 is formed along a longitudinal direction thereof.

The composite magnetic tube 10A of the foregoing structure achieves an electromagnetic wave absorption effect similar to that of the composite magnetic tube 10 shown in FIG. 1. Accordingly, it can be used as a coating tube relative to the cable for suppressing the radiation of the undesired electromagnetic waves. Further, since the composite magnetic tube 10A is formed with the slit 16, it can be easily mounted on the cable.

Figure 3:
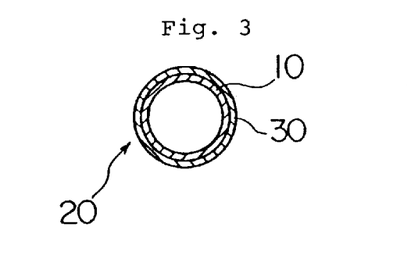
FIG. 3 is a sectional view showing a tube according to a third embodiment of the present invention.

Referring to FIG. 3, a shown tube 20 comprises a composite magnetic tube 10 and a conductor tube 30, as a shield layer, provided on an outer wall of the composite magnetic tube 10. Since a structure of the composite magnetic tube 10 is the same as that shown in FIG. 1, explanation thereof is omitted.

The conductor tube 30 may be formed of a net composed of fine conductive wires, or formed by metal plating.

The tube 20 of the foregoing structure achieves not only an electromagnetic wave absorption effect similar to that of the composite magnetic tube 10 shown in FIG. 1, but also an electromagnetic wave shielding effect based on the conductor tube 30. Further, by grounding the shield tube 30, the electromagnetic waves can be shielded more efficiently. That is, it can be used as a coating tube relative to the cable for suppressing the electromagnetic interference.

Figure 4:
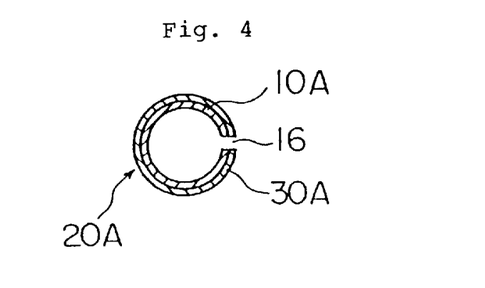
FIG. 4 is a sectional view showing a tube according to a fourth embodiment of the present invention.

Referring to FIG. 4, a shown tube 20A has the same structure as the tube 20 shown in FIG. 3 except that a slit 16 is formed along a longitudinal direction thereof. The tube 20A comprises the composite magnetic tube 10A with the slit shown in FIG. 2 and a conductor tube 30A with a slit.

The tube 20A of the foregoing structure achieves an electromagnetic wave absorption effect and an electromagnetic wave shielding effect similar to those of the tube 20 shown in FIG. 3. Accordingly, like the tube 20 of FIG. 3, it can be used as a coating tube for the cable for suppressing the electromagnetic interference. Further, since the tube 20A is formed with the slit 16, it can be easily mounted on the cable.

Figure 5:
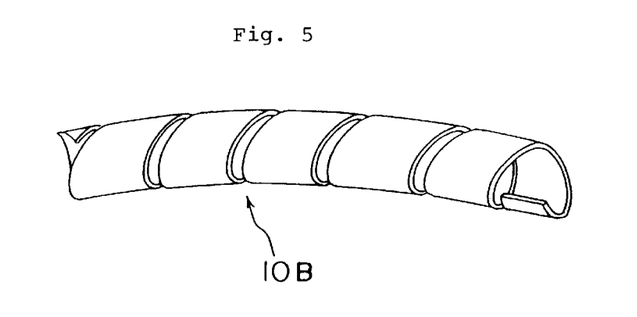
FIG. 5 is a perspective view showing a tube according to a fifth embodiment of the present invention.

Referring to FIG. 5, a shown tube 10B is a tube having a spiral structure and made of the foregoing composite magnetic material.

The tube 10B of such a spiral structure is produced by producing the composite magnetic tube 10 of FIG. 1 by the extrusion molding method and then providing a spiral slit in the annular tube to form the spiral structure.

The spiral structure tube 10B made of the composite magnetic body achieves an electromagnetic wave absorption effect similar to that of the composite magnetic tube 10 shown in FIG. 1. Accordingly, it can be used as a cover tube for the cable for suppressing the radiation of the undesired electromagnetic waves. Further, since the tube 10B has the spiral structure, it can be easily mounted on the cable.

Figure 6:
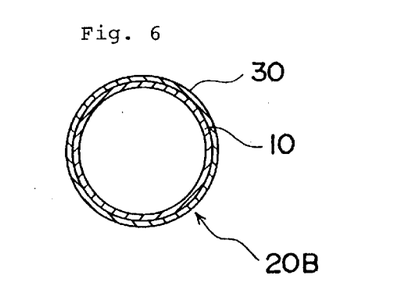
FIG. 6 is a sectional view showing a tube according to a sixth embodiment of the present invention.

Referring to FIG. 6, a shown tube 20B is a modification of the spiral structure tube 10B shown in FIG. 5, and has a two-layered structure comprising a composite magnetic layer 10 and a conductor layer 30 stacked on an outer wall of the composite magnetic layer 10. An external appearance is similar to FIG. 1 and it has a spiral structure. The composite magnetic layer 10 has the same structure as the tube 10B shown in FIG. 5. The conductor layer 30 is formed by, for example, metal plating. Naturally, it may be formed of a net composed of fine conductive wires.

The tube 20B having the two-layered spiral structure achieves not only an electromagnetic wave absorption effect similar to that of the spiral tube 10 shown in FIG. 1, but also an electromagnetic wave shielding effect based on the conductor layer 30. Accordingly, the tube 20B of the two-layered spiral structure can be used as a cover tube for the cable for suppressing the radiation of the undesired electromagnetic waves therefrom and shielding the electromagnetic waves invading from the exterior.

Figure 7:
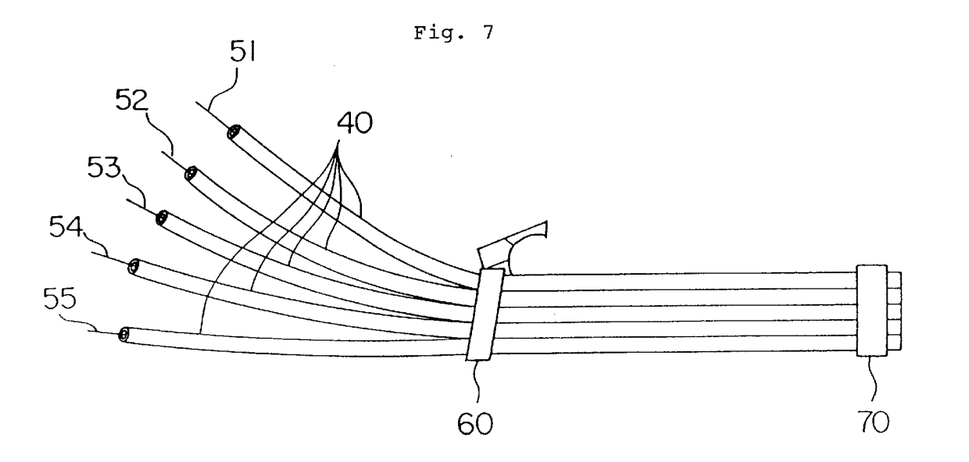
FIG. 7 is a perspective view showing a case wherein, upon bundling a plurality of vinyl coated wires by a bundling band, tubes according to the present invention are applied to the respective wires.

Referring to FIG. 7, an example is shown wherein tubes 40 according to the present invention are used as cover tubes for cables 51–55, respectively. The shown cover tube 40 may be any of the tubes shown in FIGS. 1–6.

In the shown applied example, two vinyl coated cables 51 and 52 as power lines and three vinyl coated cables 53–55 as signal lines extend from a connector 70 and bundled by a bundling band 60 on the midway. As described before, if the power lines and the signal lines are in the mixed wiring, it is possible that the electromagnetic interferences are mutually generated to cause a malfunction of the circuit. By mounting the tubes 40 on the vinyl coated cables 51–55, respectively, the mutual interferences among the vinyl coated cables 51–55 can be suppressed. When the tubes of FIGS. 3, 4 or 6 each having the outer conductor layer 30 are used, invasion of the electromagnetic noise into the cables from the exterior can also be suppressed.

Figure 8:
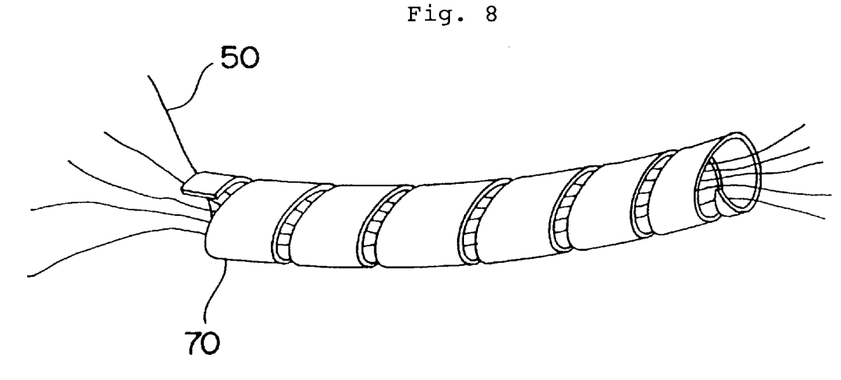
FIG. 8 is a perspective view showing a state wherein a plurality of cables are bundled by a tube of the present invention.

FIG. 8 shows an example wherein the tube of FIG. 5 or 6 is used as a bundling tube 70 for a plurality of vinyl coated cables 50. In this case, since undesired radiation from the cables 50 is absorbed by the composite magnetic layer of the bundling tube 70, the undesired radiation to the exterior can be suppressed. If the tube of FIG. 6 is used, since high frequency noise from the exterior is shielded by the conductor layer, invasion of the external noise into the cables 50 can be prevented. On the other hand, as shown in FIG. 7, the tubes 40 of the present invention may be applied to each of the cables 50. In this case, it is needless to say that the mutual interferences among the cables 50 can be suppressed.

Although the tube from FIG. 1 to FIG. 4 may be used as the bundling tube 70, the tube with the slit shown in FIG. 2 or 4 may be convenient since the cables can be inserted more easily. However, the cables are liable to come off via the slit so that, in this case, it is better to tie up the circumference thereof by the bundling band of FIG. 5.

For verifying the electromagnetic radiation suppressing and shielding effects of the tube of the present invention, the following test was carried out. Soft magnetic powder and an organic binding agent used in the test are shown in Table 1 below.

TABLE 1

| | |
|---|---|
| Soft magnetic powder<br>Composition: Fe—Al—Si alloy<br>Average particle diameter: 45 μm<br>Aspect ratio: >5<br>Annealing: Ar atmosphere<br>660° C., 2 hours | 80 weight parts |
| Organic binding agent<br>ABS resin | 20 weight parts |

It was confirmed that the soft magnetic powder was vapor-phase oxidized in an atmosphere of nitrogen-oxygen mixed gas at a 20% oxygen partial pressure and that oxide films were formed on the surfaces thereof. The soft magnetic powder and the organic binding agent were heated, mixed and processed to obtain a formed body (composite magnetic body). The surface resistance of the composite magnetic body was measured and found to be $1 \times 10^6$ Ω.

Figure 9:
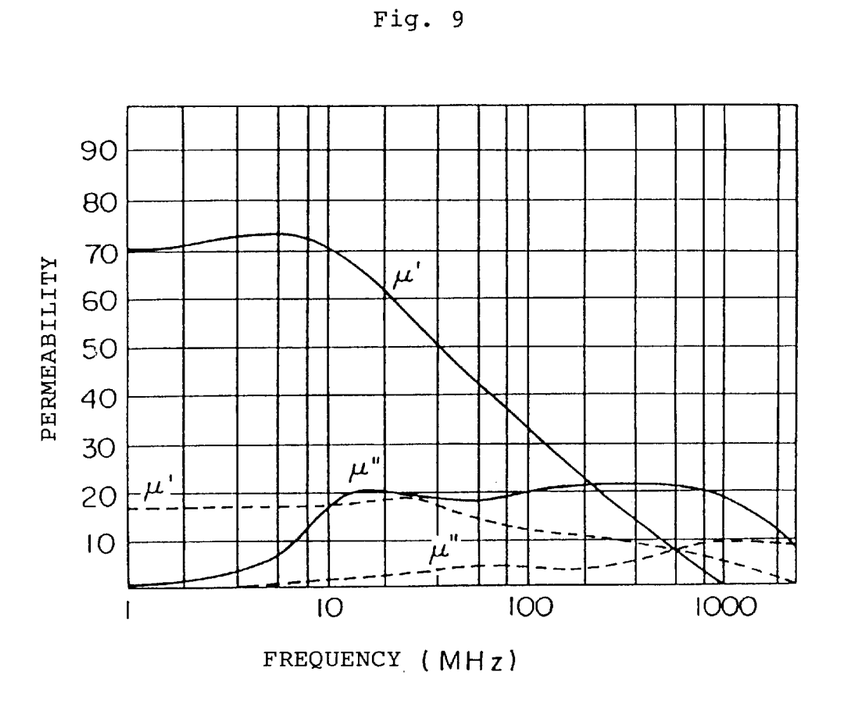
FIG. 9 is a graph showing frequency characteristic ($\mu$-f characteristic) curves of permeability of an example of a composite magnetic body used in the present invention.

FIG. 9 shows measurement results of a permeability-frequency ($\mu$-f) characteristic of the composite magnetic body. In FIG. 9, an axis of abscissa represents frequency (MHz) and an axis of ordinate represents permeability. As is well known, a permeability $\mu$ is a combination of a real part permeability $\mu'$ being a real part component and an imaginary part permeability $\mu''$ being an imaginary part component. The ratio ($\mu''/\mu'$) between the real part permeability $\mu'$ and the imaginary part permeability $\mu''$ represents a loss coefficient tanδ. The imaginary part permeability $\mu''$ represents a magnetic loss term necessary for absorbing the electromagnetic waves. Thus, as this value increases, the electromagnetic waves can be more absorbed. In FIG. 9, dotted lines represent frequency characteristics of the real part permeability $\mu'$ and the imaginary part permeability $\mu''$ in the composite magnetic body before annealing, while solid lines represent frequency characteristics of the real part permeability $\mu'$ and the imaginary part permeability $\mu''$ in the composite magnetic body after annealing.

As evident from the dotted lines in FIG. 9, the imaginary part permeability $\mu''$ of the composite magnetic body before annealing has two peaks appearing at different frequencies, and it is thus observed that the magnetic resonance occurs at two points. After the composite magnetic body is subjected to the annealing, as shown by the solid lines in FIG. 9, the imaginary part permeability $\mu''$ of the composite magnetic body reveals high values over a wide range, and the real part permeability $\mu'$ also reveals large values at high frequencies.

Figure 10:
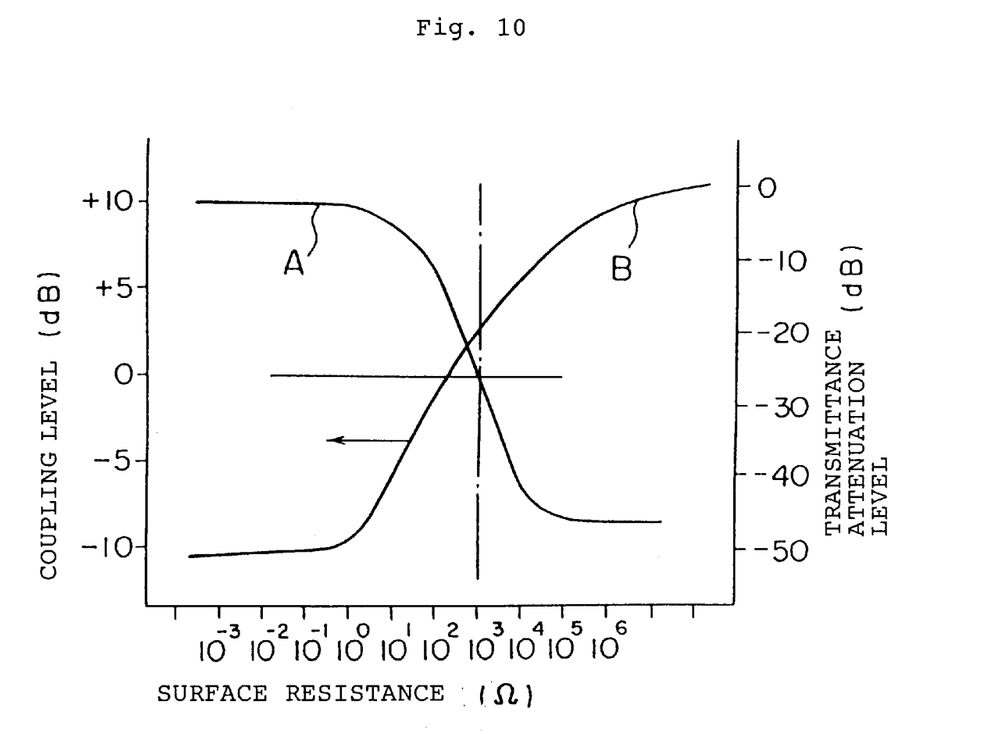
FIG. 10 is a graph showing a relationship of transmittance attenuation level and coupling level measured by a measuring apparatus shown in FIGS. 11 and 12, with respect to the surface resistance of a composite magnetic body used in the present invention.

The present inventors have studied about how to set the surface resistance of the composite magnetic body for absorbing the electromagnetic waves more effectively. Specifically, the present inventors measured a transmittance attenuation level and a coupling level relative to a surface resistance of the composite magnetic body. As a result, the present inventors obtained a relationship as shown in FIG. 10. In FIG. 10, A represents transmittance attenuation levels (dB), while B represents coupling levels (dB). From FIG. 10, it is understood that the surface resistance of the composite magnetic body should be not less than $10^3$ Ω for preventing transmittance of the electromagnetic waves to the exterior and further preventing reflection of the electromagnetic waves to the interior.

<Sample 1>

A sample plate with a mean thickness of 1 mm was formed using the foregoing composite magnetic body.

<Sample 2>

A sample plate of a three-layered structure was obtained by forming the composite magnetic body into two layers and applying copper plating of 10 μ in thickness therebetween. The mean plate thickness in total was 1 mm.

<Comparative Sample>

As a comparative sample, a synthetic resin plate of 1 mm in mean thickness having a copper foil tape of 35 μm in thickness wound therearound was used.

Figure 11:
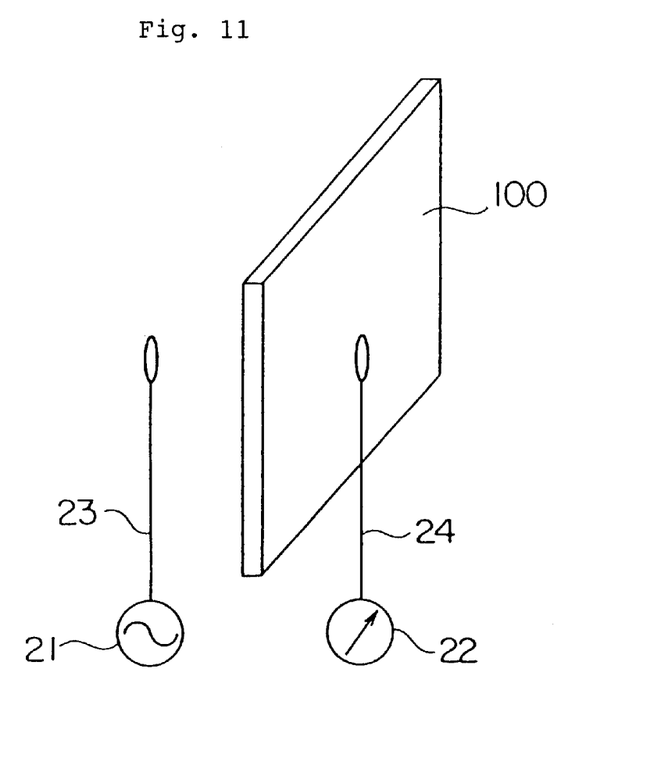
FIG. 11 shows an evaluating system in case of measuring transmittance attenuation levels to be used for evaluating an electromagnetic wave suppressing effect of the present invention.
Figure 12:
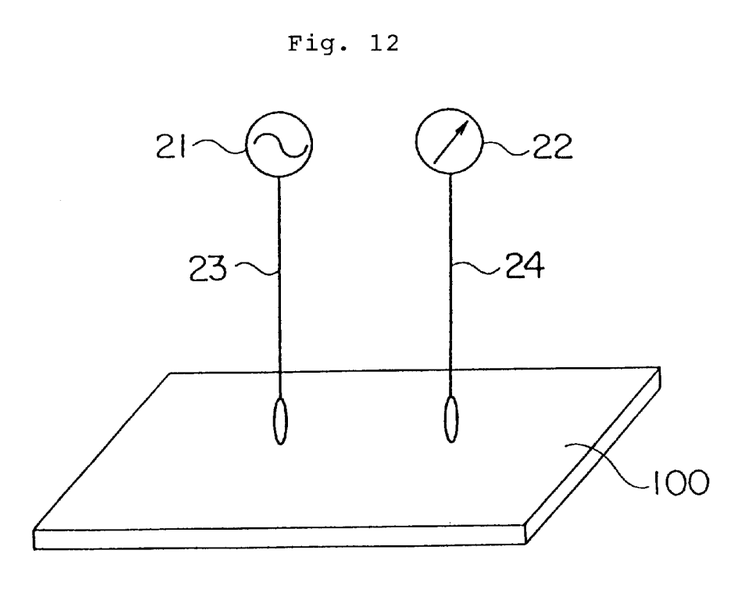
FIG. 12 shows an evaluating system in case of measuring coupling levels.

For evaluating sample 1, sample 2 and the comparative sample, transmittance attenuation levels and coupling levels thereof were measured using a measuring apparatus shown in FIGS. 11 and 12. The measuring apparatus comprises an electromagnetic wave generator 21, an electromagnetic field strength measuring device (reception element) 22, an electromagnetic field transmitting micro-loop antenna 23 having a loop diameter of not greater than 2 mm and connected to the electromagnetic wave generator 21, and an electromagnetic field receiving micro-loop antenna 24 having a loop diameter of not greater than 2 mm and connected to the electromagnetic field strength measuring device 22. As the electromagnetic field strength measuring device 22, a spectrum analyzer, for example, can be used, and the measurement was carried out using as a reference an electromagnetic field strength in the state where an evaluation sample 100 was not present.

FIG. 11 shows an evaluating system for measuring the transmittance attenuation level [dB] using the measuring apparatus, wherein the evaluation sample 100 is disposed between the electromagnetic field transmitting micro-loop antenna 23 and the electromagnetic field receiving micro-loop antenna 24. FIG. 12 shows an evaluating system for measuring the coupling level [dB] using the measuring apparatus, wherein the electromagnetic field transmitting micro-loop antenna 23 and the electromagnetic field receiving micro-loop antenna 24 are disposed confronting one side of the evaluation sample 100.

Figure 13:
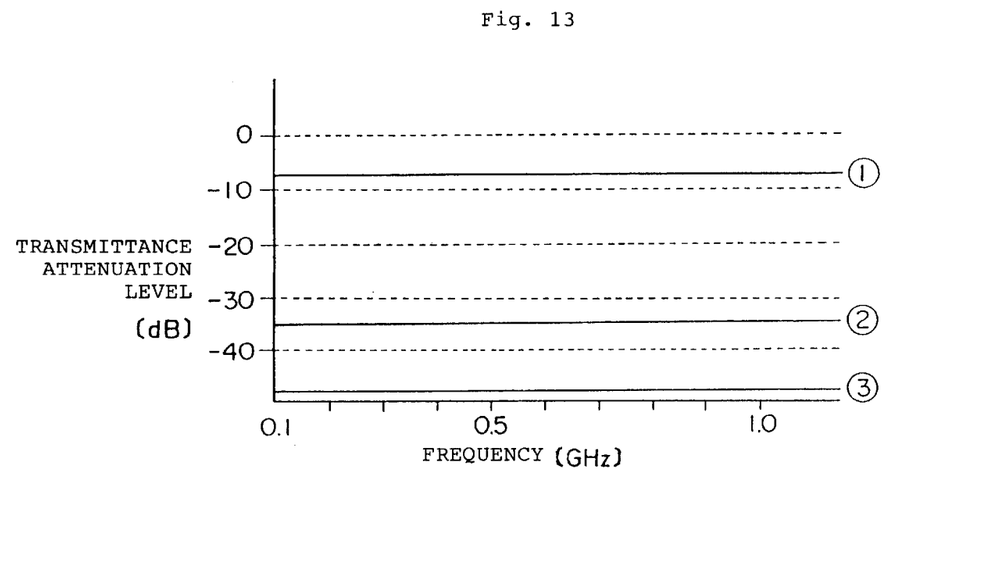
FIG. 13 shows transmittance attenuation levels of a plate (sample 1) made of a composite magnetic body used in the present invention, a stacked plate (sample 2) of a composite magnetic body and a conductor layer, and synthetic resin with a copper foil (comparative sample).
Figure 14:
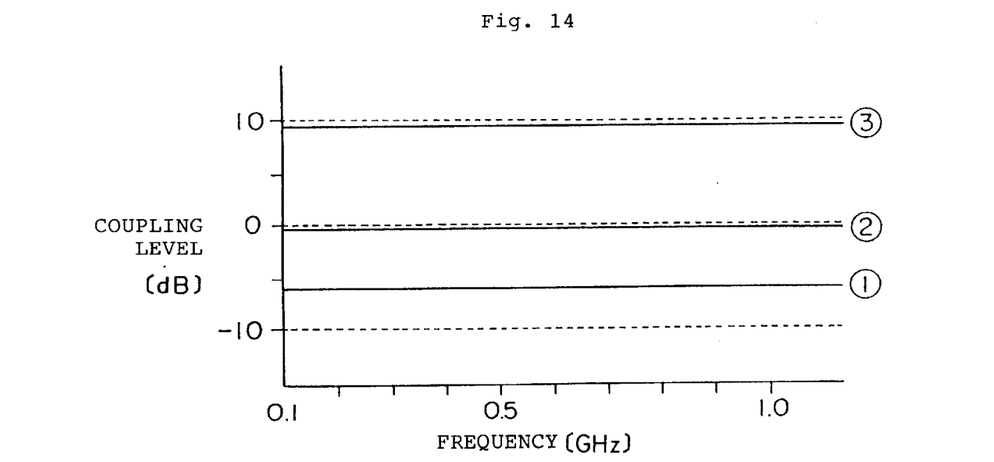
FIG. 14 shows coupling levels of the same respective samples.

FIGS. 13 and 14 show the transmittance attenuation levels [dB] and the coupling levels [dB] measured by the evaluating systems shown in FIGS. 11 and 12 with respect to sample 1, sample 2 and the comparative sample. In FIG. 13, an axis of abscissa represents frequency [GHz] and an axis of ordinate represents transmittance attenuation level [dB]. In FIG. 14, an axis of abscissa represents frequency [GHz] and an axis of ordinate represents coupling level [dB]. In FIGS. 13 and 14, sample 1 is represented by ①, sample 2 by ②, and the comparative sample by ③.

From FIGS. 13 and 14, the followings are understood. In sample 1, the transmittance attenuation level was about −7.5 [dB] in a measurement frequency range, and the coupling level was about −6 [dB] in the measurement frequency range. That is, in sample 1, it is understood that the transmittance attenuation level and the coupling level were both reduced. In sample 2, the transmittance attenuation level was about −34.5 [dB] in the measurement frequency range, and it is thus understood that the transmittance attenuation level was further reduced as compared with sample 1, and hence the electromagnetic wave shielding and absorbing effects were enhanced. On the other hand, the coupling level of sample 2 was about −0.5 [dB] in the measurement frequency range, and it is thus understood that it was also reduced although not so much as compared with sample 1.

On the contrary, in the comparative sample, the transmittance attenuation level was about −47.5 [dB] in the measurement frequency range and thus much reduced as compared with samples 1 and 2. However, the coupling level of the comparative sample was as high as about +9.5 [dB] in the measurement frequency range, and it is thus understood that the coupling level was very high as compared with samples 1 and 2.

From the foregoing, the tube of the present invention, when used in the electric cable, can suppress the radiation of the undesired electromagnetic waves effectively and does not induce the secondary reflection noise. Accordingly, it is understood that it is excellent for coating and bundling the electric cables.

While the present invention has been described by citing some embodiments, it is needless to say that the present invention is not limited thereto, but can be modified in various ways without departing from the gist of the present invention.

Industrial Applicability

As described above, the tube using the composite magnetic body according to the present invention can suppress the radiation of the undesired electromagnetic waves from the cable when used for coating and bundling the cables radiating the undesired electromagnetic waves. Further, by forming the slit in the tube along the longitudinal direction thereof, the tube can be easily mounted on the cable. Further, by using the combined structure of the composite magnetic tube and the shield tube, the influence of the radiant noise from the exterior can also be shielded.

What is claimed is:

1. An electromagnetic interference suppressing tube for use as a cover of at least one electric cable, which comprises a tubular layer, said tubular layer being made of a composite magnetic body which comprises a soft magnetic powder having a flat configuration and an organic binding agent in which said soft magnet powder is dispersed, said composite magnetic body having a magnetic characteristic wherein a magnetic resonance occurs at least two different frequency points over a frequency range of 10–1000 MHz.

2. An electromagnetic interference suppressing tube as claimed in claim 1, wherein said soft magnetic powder is a soft magnetic metallic powder having a metallic oxide film formed on a surface of the powder and said composite magnetic body has a surface electric resistance of $10^3$ Ω.

3. An electromagnetic interference suppressing tube as claimed in claim 2, wherein said soft metallic powder is a powder of at least one selected from Fe—Al—Si alloy and Fe—Ni alloy.

4. An electromagnetic interference suppressing tube as claimed in claim 1, wherein said organic binding agent is an elastomer.

5. An electromagnetic interference suppressing tube as claimed in claim 1, wherein said organic binding agent is thermoplastic resin selected from a group of polyester resin, polyvinyl chloride resin, polyvinyl butyral resin, polyurethane resin, cellulose resin, nitrile-butadiene rubber, styrene-butadiene rubber, and copolymers and mixtures thereof.

6. An electromagnetic interference suppressing tube as claimed in claim 1, which further comprises a conductor layer provided on an outer surface of said tubular layer.

7. An electromagnetic interference suppressing tube as claimed in claim 6, wherein said conductor layer comprises a net composed of fine conductive wires.

8. An electromagnetic interference suppressing tube as claimed in claim 6, which further comprises an outer layer provided on an outer-surface of said conductor layer, said outer layer being made of said composite magnetic body.

9. An electromagnetic interference suppressing tube as claimed in claim 1, which is formed with a slit extending in a longitudinal direction thereof.

10. An electromagnetic interference suppressing tube as claimed in claim 1, which is formed with a cut line extending spirally in a longitudinal direction thereof so as to have a spiral structure.

* * * * *